United States Patent
Farrell et al.

(10) Patent No.: US 8,076,994 B2
(45) Date of Patent: Dec. 13, 2011

(54) RF POWER TRANSISTOR PACKAGES WITH INTERNAL HARMONIC FREQUENCY REDUCTION AND METHODS OF FORMING RF POWER TRANSISTOR PACKAGES WITH INTERNAL HARMONIC FREQUENCY REDUCTION

(75) Inventors: Donald Farrell, Raleigh, NC (US);
Simon Wood, Raleigh, NC (US)

(73) Assignee: Cree, Inc., Durham, NC (US)

( * ) Notice: Subject to any disclaimer, the term of this patent is extended or adjusted under 35 U.S.C. 154(b) by 857 days.

(21) Appl. No.: 11/767,161

(22) Filed: Jun. 22, 2007

(65) Prior Publication Data

US 2008/0315392 A1    Dec. 25, 2008

(51) Int. Cl.
*H03H 7/38* (2006.01)
(52) U.S. Cl. ............................................ 333/32; 330/302
(58) Field of Classification Search .............. 333/32–34; 330/149, 302–306
See application file for complete search history.

(56) References Cited

U.S. PATENT DOCUMENTS

| | | | | |
|---|---|---|---|---|
| 3,662,294 | A | * | 5/1972 | Jacobs et al. .................... 333/33 |
| 5,010,588 | A | * | 4/1991 | Gimlett .......................... 398/202 |
| 5,592,122 | A | * | 1/1997 | Masahiro et al. ............. 330/286 |
| 5,748,042 | A | * | 5/1998 | Norris et al. ................... 330/277 |
| 5,818,880 | A | * | 10/1998 | Kriz et al. ...................... 375/306 |
| 6,670,801 | B2 | * | 12/2003 | Jian et al. ......................... 324/95 |
| 6,778,020 | B2 | * | 8/2004 | Ohta et al. ..................... 330/302 |
| 6,798,295 | B2 | | 9/2004 | Pengelly et al. |
| 6,806,106 | B2 | | 10/2004 | Leighton et al. |
| 6,806,767 | B2 | * | 10/2004 | Dow ................................. 330/51 |
| 6,822,321 | B2 | | 11/2004 | Crescenzi, Jr. |
| 2002/0020894 | A1 | | 2/2002 | Nishijima |
| 2004/0145034 | A1 | | 7/2004 | Fujioka et al. |
| 2007/0057731 | A1 | * | 3/2007 | Le ................................... 330/302 |

FOREIGN PATENT DOCUMENTS

EP    0 949 754 A2    10/1999

(Continued)

OTHER PUBLICATIONS

Dupuy et al., "Class F Power Amplifier Using a Multi-Frequency Composite Right/Left Handed Transmission Line Harmonic Tuner", Microwave Symposium Digest, 2005 IEEE MTT-S International Long Beach, CA, USA, Jun. 12-17, 2005; IEEE, Piscataway, NJ, USA, Jun. 12, 2005, pp. 2023-2026, XP010844961.

(Continued)

*Primary Examiner* — Robert Pascal
*Assistant Examiner* — Kimberly Glenn
(74) *Attorney, Agent, or Firm* — Myers Bigel Sibley & Sajovec

(57) ABSTRACT

A packaged RE power device includes a transistor having a control terminal and an output terminal and configured to operate at a fundamental operating frequency, an RF signal input lead coupled to the control terminal, and an RF signal output lead coupled to the output terminal. A harmonic reducer is coupled to the control terminal and/or the output terminal of the transistor and is configured to provide a short circuit or low impedance path from the control terminal and/or the output terminal to ground for signals at an Nth harmonic frequency of the fundamental operating frequency, where N>1. The device further includes a package that houses the transistor and the harmonic reducer, with the input lead and the output lead extending from the package. Multi-chip packages are also disclosed.

22 Claims, 10 Drawing Sheets

FOREIGN PATENT DOCUMENTS

| | | |
|---|---|---|
| EP | 0 949 754 A3 | 10/1999 |
| JP | 9162657 (A) | 6/1997 |

OTHER PUBLICATIONS

International Search Report and Written opinion (15 pages) corresponding to International Application No. PCT/US2008/006722; Mailing Date: Dec. 9, 2008.

Japanese Office Action for corresponding JP Application No. 2010-513188 mailed Aug. 26, 2011.

\* cited by examiner

RF POWER TRANSISTOR PACKAGES WITH INTERNAL HARMONIC FREQUENCY REDUCTION AND METHODS OF FORMING RF POWER TRANSISTOR PACKAGES WITH INTERNAL HARMONIC FREQUENCY REDUCTION

FIELD

This invention relates generally to RF and microwave transistors, and more particularly the invention relates to methods for improving linearity of packaged RF power transistors, and packaged RF power transistors having improved linearity.

BACKGROUND

Improved linearity during high-frequency operation is a goal in RF power transistor technologies. Many factors can affect the linearity of a device in various RF power transistor technologies, including changing input and impedance with signal level, changing capacitances and their derivatives with signal levels, breakdown and substrate conduction effects, class of operation, and changing transconductance and its derivatives with bias and signal levels. In addition, in some applications, it may be desirable for an RF power transistor to achieve a desired level of linearity over a wide range of operating frequencies and/or output power levels.

SUMMARY

A packaged RF power device according to some embodiments of the invention includes a transistor including a control terminal and an output terminal and configured to operate at a fundamental operating frequency, an RF signal input lead coupled to the control terminal of the transistor, and an RF signal output lead coupled to the output terminal of the transistor. The packaged device further includes a harmonic reducer coupled to the control terminal and/or the output terminal of the transistor and configured to provide a short circuit or low impedance path from the control terminal and/or the output terminal to ground for signals at a harmonic frequency of the fundamental operating frequency. The device further includes a package that houses the transistor and the harmonic reducer, with the RF signal input lead and the RF signal output lead extending from the package. The harmonic frequency may, for example, include a second harmonic frequency.

The harmonic reducer may be coupled to the control terminal, and the packaged RF power device may further include an output-side harmonic reducer connected to the output terminal of the transistor. The harmonic reducer may include a first capacitor having a first capacitance, and the output-side harmonic reducer may include a second capacitor having a second capacitance that is different from the first capacitance.

The packaged RF power device may further include an input matching circuit between the RF signal input lead and the control terminal of the transistor. The harmonic reducer may be coupled between the input matching circuit and the control terminal of the transistor.

The harmonic reducer may include a series resonant circuit including an inductive element and a shunt capacitor connected in series to a ground terminal. The packaged RF power device may further include a base. The transistor is on the base and the shunt capacitor may be on the base between the transistor and the RF output lead. The inductive element may include a bond wire extending from the transistor to the shunt capacitor.

The packaged RF power device may further include a second bond wire extending over the shunt capacitor from the transistor to the RF output lead.

In some embodiments, the harmonic reducer may include an open circuit quarter-wave transmission line stub. The open circuit quarter-wave transmission line stub may have a length selected to provide a short circuit or low impedance path to ground for signals at the harmonic frequency of the fundamental operating frequency.

A packaged RF power device according to further embodiments of the invention includes a transistor including a control terminal and an output terminal and configured to operate at a fundamental operating frequency, an RF signal input lead coupled to the control terminal of the transistor, and an RF signal output lead coupled to the output terminal of the transistor. A harmonic reducer is coupled to the control terminal and/or the output terminal of the transistor and is configured to provide a short circuit or low impedance path from the control terminal and/or the output terminal to ground for signals at an Nth harmonic frequency of the fundamental operating frequency, where $N>1$. The device further includes a package that houses the transistor, the ground terminal and the harmonic reducer, with the input lead and the output lead extending from the package.

The packaged RF power device may further include a further harmonic reducer housed in the package and coupled to the control terminal and/or the output terminal of the transistor. The further harmonic reducer is configured to provide a second short circuit or low impedance path from the control terminal and/or the second output terminal to ground for signals at an Mth harmonic frequency of the fundamental operating frequency, where $M>1$ and $M \neq N$.

The harmonic reducer and the further harmonic reducer can each include a series resonant circuit including an inductive element and a capacitor. In some embodiments, at least one of the harmonic reducer and the further harmonic reducer may include an open circuit quarter-wave transmission line stub.

Some embodiments of the invention provide methods of forming a packaged RF power device. The methods include mounting a transistor on a base, the transistor including a control terminal and an output terminal and being configured to operate at a fundamental operating frequency, forming a harmonic signal reducer on the base and connecting the harmonic signal reducer to the control terminal and/or the output terminal of the transistor. The harmonic signal reducer is configured to provide a short circuit or low impedance path from the control terminal and/or the second output terminal to ground for signals at an Nth harmonic frequency of the fundamental operating frequency, where $N>1$.

The methods further include providing an RF signal input lead and an RF signal output lead on opposite sides of the base, connecting the RF signal input lead to the control terminal and connecting the RF signal output lead to the output terminal, and forming a package housing on the transistor and the harmonic reducer, with the RF signal input lead and the RF signal output lead extending from the package.

Forming the harmonic signal reducer may include providing a capacitor on the base and forming a wire bond connection between the capacitor and the transistor.

Providing the capacitor on the base may include providing the capacitor on the base between the output terminal of the transistor and the RF signal output lead, and forming the wire bond connection may include forming the wire bond connection between the capacitor and the output terminal of the transistor.

Connecting the RF signal output lead to the output terminal may include forming a second wire bond connection, the second wire bond connection including a bond wire extending over the capacitor from the output terminal to the RF signal output lead.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
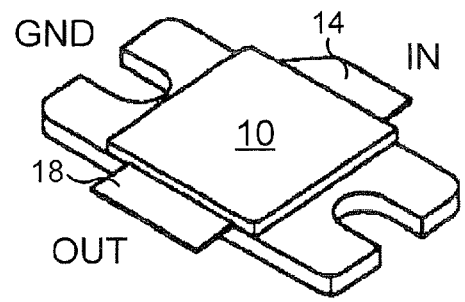
FIG. 1A is a perspective view of a packaged RF power transistor.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Some embodiments of the invention provide packaged RF power transistors. RF power transistors typically include a plurality of transistor cells operating in parallel. Transistors that can be included in packages according to embodiments of the invention can include laterally diffused MOSFETS (LDMOSFET) or other semiconductor devices, such as bipolar devices, MESFET devices, HBTs and HEMT devices. The transistors can be made using narrow or wide bandgap semiconductors. For example, the transistors can include silicon LDMOS and/or bipolar transistors, and/or III-V devices such as GaAs MESFETs, InGaP HBTs, GaN HEMT devices, GaN bipolar transistors, etc.

Figure 1B:
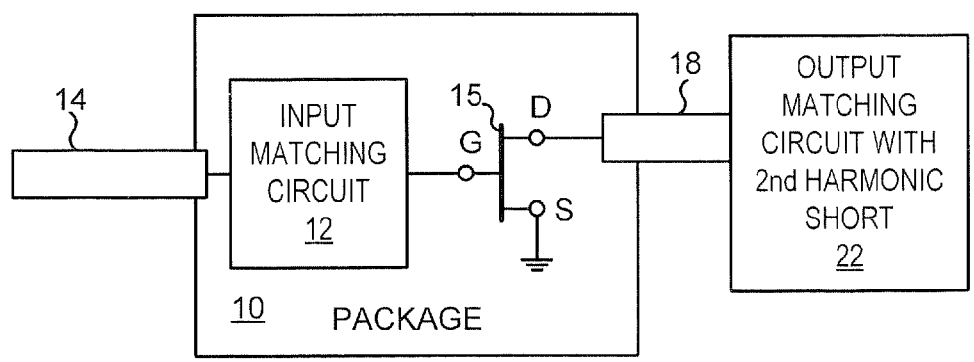
FIG. 1B is a functional block diagram of a conventional RF power transistor.

RF power transistors providing 10 watts or more of power can be packaged as discrete devices, as shown generally at 10 in FIG. 1A and schematically in FIG. 1B. The packaged transistor 15 (which may include a FET or bipolar device, for example) normally includes an input matching circuit 12 connecting an RF signal input lead 14 to a control electrode of a transistor 15 (e.g., a gate G of a FET or a base of a bipolar transistor). An RF signal output lead 18 is connected to an output electrode of the transistor 15 (e.g., the drain D of a FET or the collector or emitter of a bipolar transistor). The RF signal input lead 14 and the RF signal output lead 18 extend outside the package 10, as shown in FIG. 1A. The source S of a FET 15 may be grounded.

A packaged transistor 10 may be mounted on a printed circuit board (not shown). An external output matching circuit 22 may also be mounted on the printed circuit board. A bias/RF diplexer (not shown) may be connected to the external output matching circuit to connect the transistor output to an RF output. Furthermore, a DC power supply (not shown) may be connected to the transistor output lead 18.

Internal matching networks have been provided within RF power transistor packages. However, such internal matching networks are typically provided to match the fundamental operating frequency of the device, rather than a harmonic frequency.

As shown in FIG. 1B, the external output matching circuit 22 can include a harmonic short that is intended to reduce the energy in the output signal of signals at the second harmonic frequency of the fundamental operating frequency of the transistor 15. However, it may be difficult to achieve a harmonic short at the package output lead due at least in part to the additional parasitic resonances that are added, which may reduce the bandwidth of the transistor 10.

According to some embodiments of the invention, a harmonic reducer can be provided inside the device package, so that harmonic reduction can occur before the signal reaches the RF signal output lead 18. Thus, some embodiments of the invention may improve linearity of a packaged RF power transistor by reducing second and/or higher order harmonics within the device package itself. Placing the harmonic reducer inside the package may improve the performance of the harmonic reducer across a broad range of frequencies and/or output power levels. Furthermore, design of an external output matching circuit may be simplified, since the signal output from the package may have lower energy at harmonic frequencies.

Figure 2A:
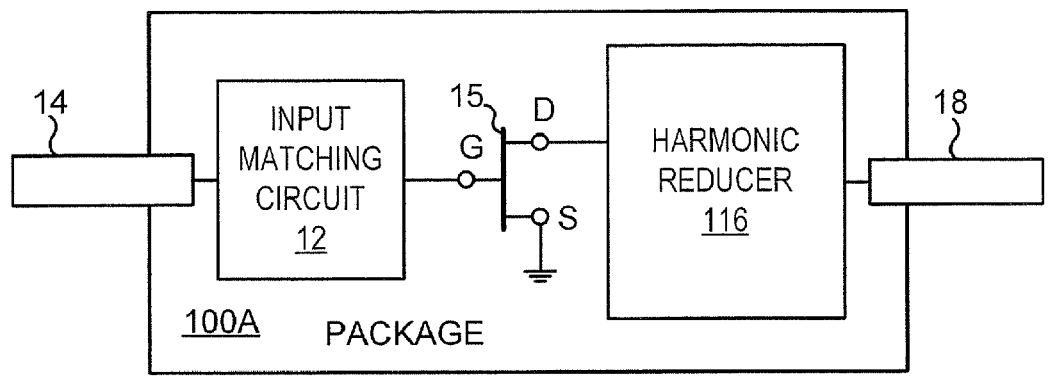
FIGS. 2A-2L are functional block diagrams of packaged RF power transistors according to some embodiments of the invention.
Figure 2B:
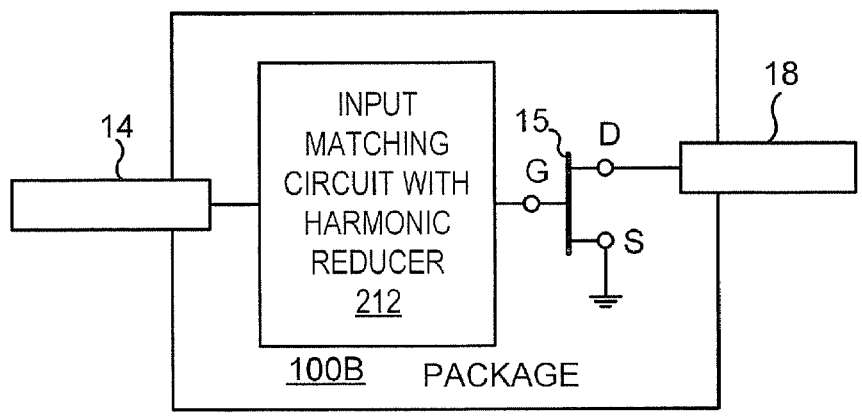
Figure 2C:
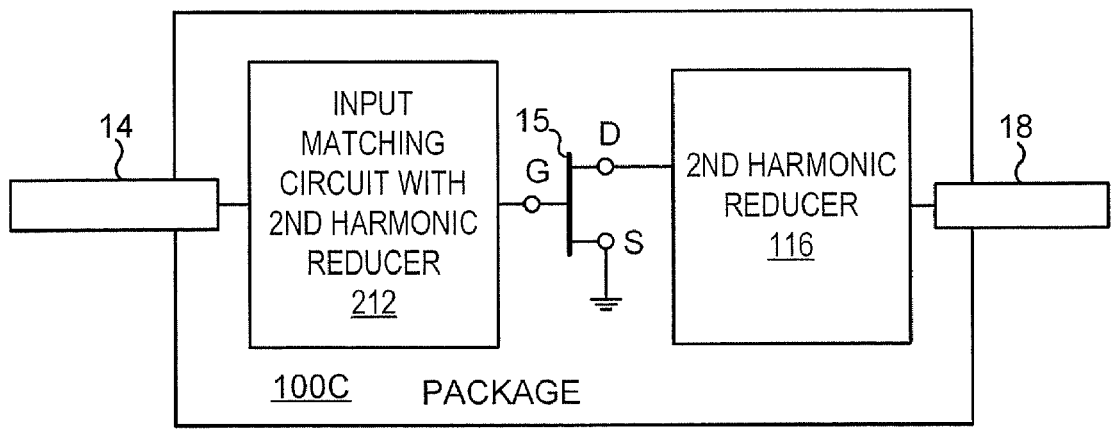

For example, as shown in FIG. 2A, a harmonic reducer 116 can be included within a package 100A including an RF power transistor 15 at the output (drain) of the transistor 15. The harmonic reducer 116 is configured to reduce the energy at a harmonic frequency, such as the second harmonic frequency, in the output signal. In some embodiments, as shown in FIG. 2B, a package 100B including an RF power transistor 15 can include an input matching circuit 212 including a harmonic reducer that is connected to a control electrode (e.g., the gate G) of the transistor 15. The harmonic reducer in the input matching circuit 212 with harmonic reducer is configured to reduce the energy at a harmonic frequency, such as the second harmonic frequency, in the input signal. In some embodiments, as shown in FIG. 2C, a package 100C including an RF power transistor 15 can include an input matching circuit 212 including a harmonic reducer that is connected to a control electrode of the transistor 15, as well as a harmonic reducer 116 at the output of the transistor 15.

Figure 2D:
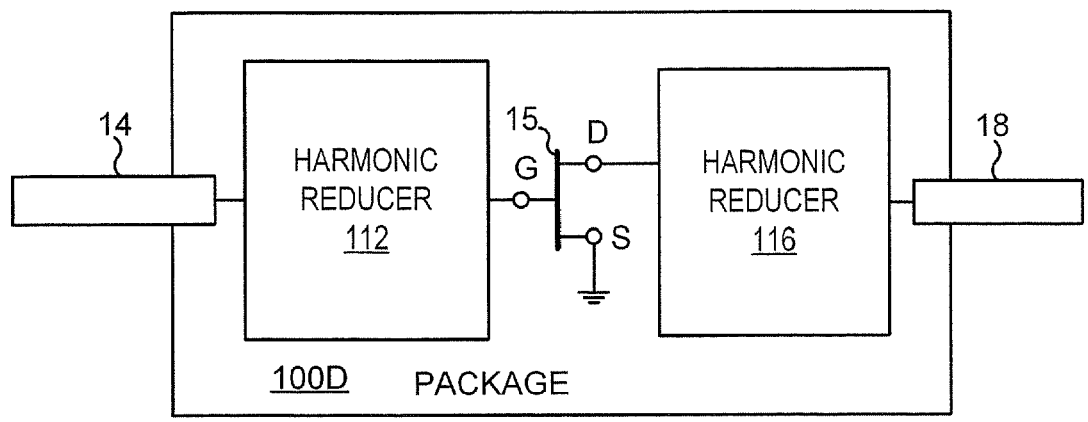
Figure 2E:
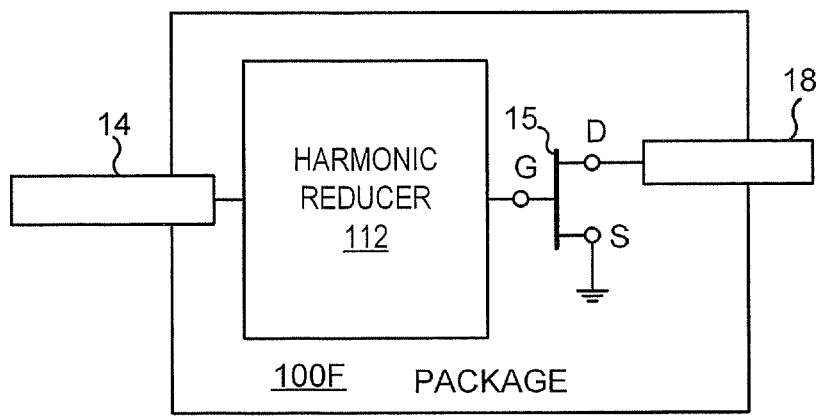
Figure 2F:
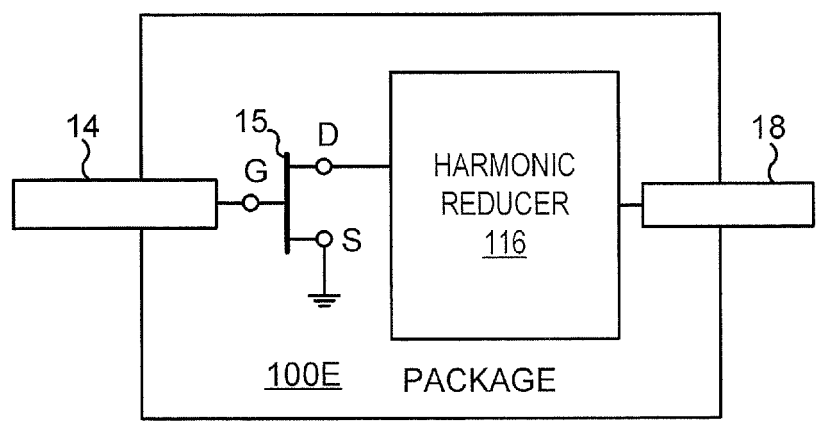

In some embodiments, a package including an RF transistor may not include an input matching circuit. For example, as shown in FIG. 2D, a package 100D including an RF transistor 15 may include a harmonic reducer 112 that is connected to a control electrode (e.g., the gate G) of the transistor 15 and a harmonic reducer 116 at the output (drain) of the transistor 15. In some embodiments, as shown in FIG. 2E, a package 100E including an RF transistor 15 may include a harmonic reducer 112 that is connected to the control electrode of the transistor 15, with no harmonic reducer at the output. Similarly, as shown in FIG. 2F, a package 100F including an RF transistor 15 may include a harmonic reducer 116 that is connected to the output of the transistor 15, with no harmonic reducer at the input.

Figure 2G:
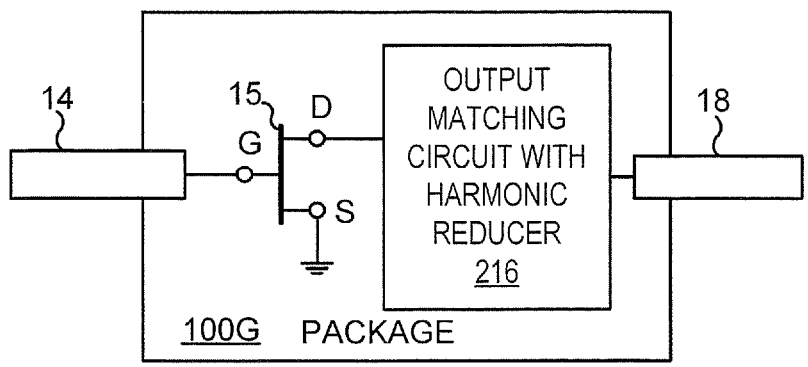
Figure 2H:
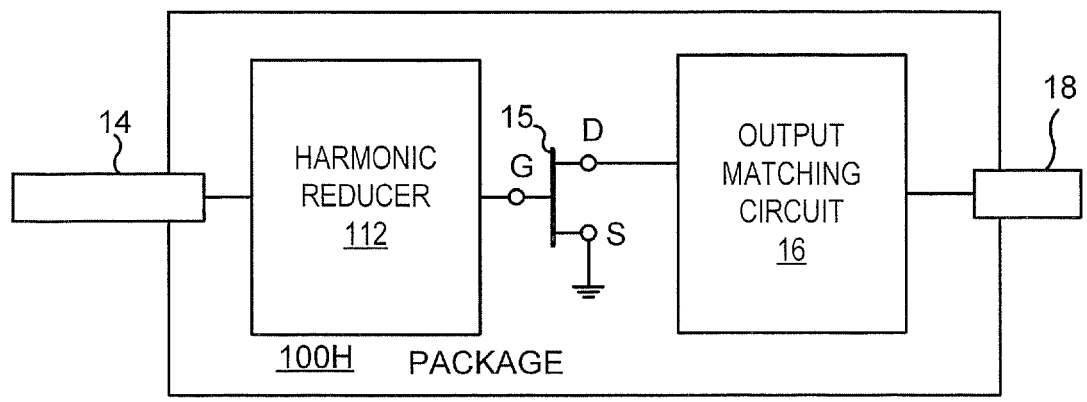
Figure 2I:
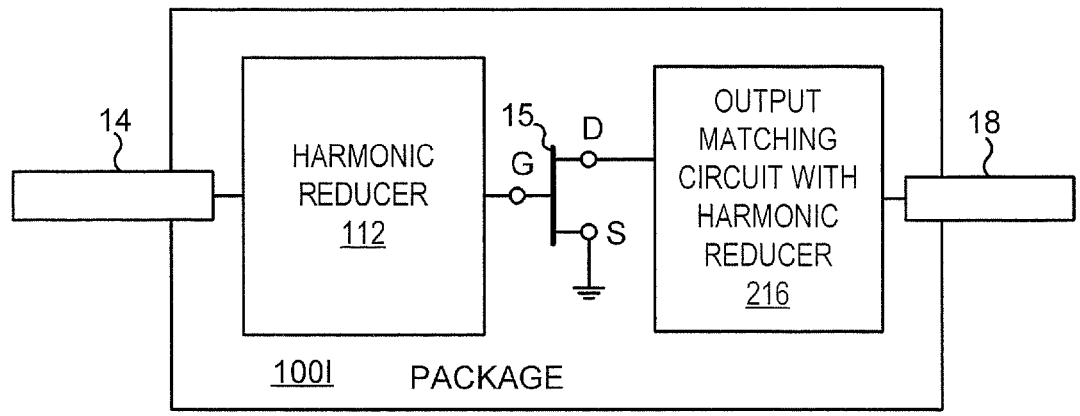

Some embodiments of the invention may include an output matching circuit connected to the output of the transistor 15. For example, as shown in FIG. 2G, a package 100G including an RF transistor 15 includes an output matching circuit 216 including a harmonic reducer connected at an output of the transistor 15. In some embodiments, as shown in FIG. 2H, a package 100H including an RF transistor 15 may include a harmonic reducer 112 that is connected to the control electrode of the transistor 15, and an output matching circuit 16 connected at the output. As shown in FIG. 2I, a package 100I including an RF transistor 15 may include a harmonic reducer 112 that is connected to the input of the transistor 15, and an output matching circuit 216 with a harmonic reducer connected at the output of the transistor 15.

Figure 2J:
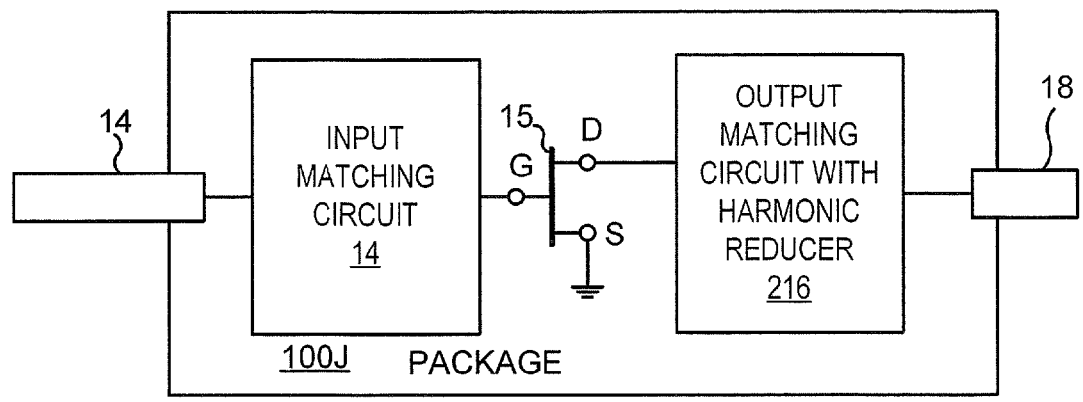
Figure 2K:
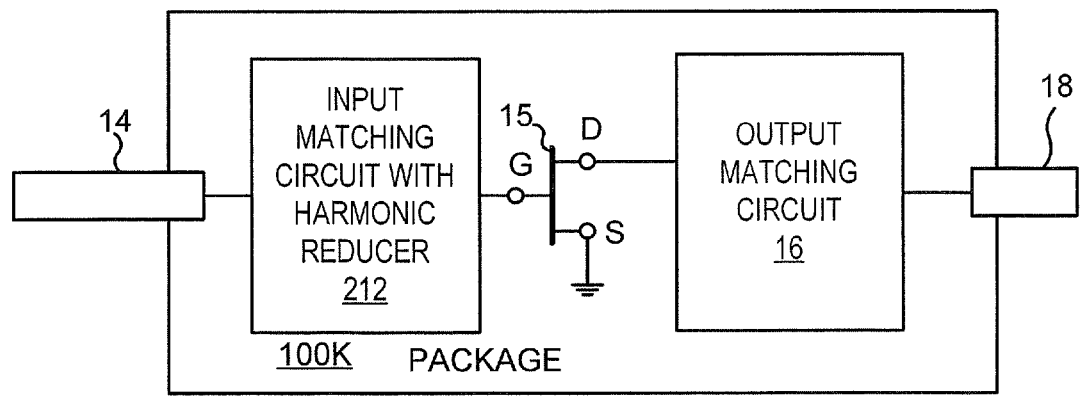
Figure 2L:
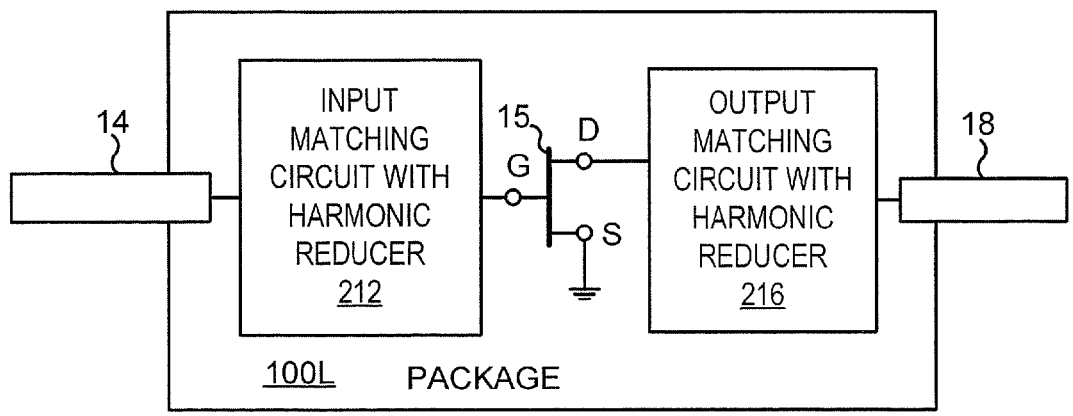

Some embodiments of the invention may include an output matching circuit connected to the output of the transistor 15 as well as an input matching circuit connected to the input of transistor. For example, as shown in FIG. 2J, a package 100J including an RF transistor 15 includes an input matching circuit 14 and an output matching circuit 216 including a harmonic reducer connected at an output of the transistor 15. In some embodiments, as shown in FIG. 2K, a package 100K including an RF transistor 15 may include an input matching circuit 212 including a harmonic reducer that is connected to the control electrode of the transistor 15, and an output matching circuit 16 connected at the output. As shown in FIG. 2L, a package 100L including an RF transistor 15 may include an input matching circuit 212 including a harmonic reducer that is connected to the input of the transistor 15, and an output matching circuit 216 with a harmonic reducer connected at the output of the transistor 15.

Figure 3:
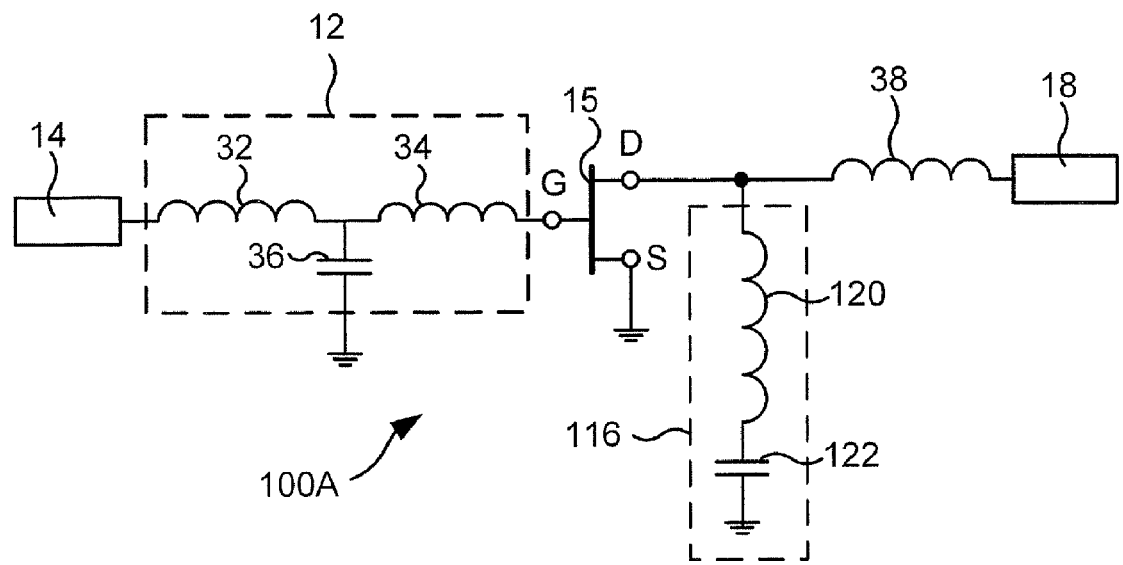
FIG. 3 is a schematic circuit diagram of a packaged RF power transistor according to some embodiments of the invention.
Figure 4:
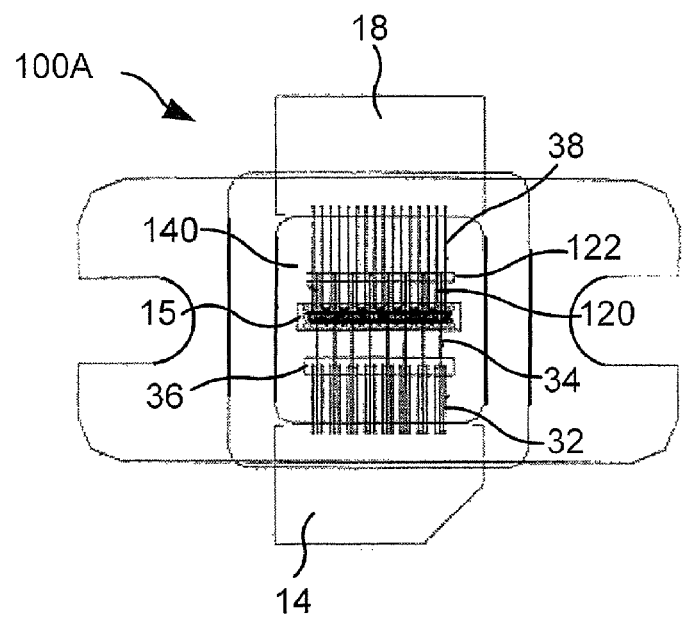
FIG. 4 is a plan view of a layout of a packaged RF power transistor according to some embodiments of the invention.

A schematic circuit diagram for a package 100A including an RF power transistor 15 including a harmonic reducer 116 according to embodiments of the invention is illustrated in FIG. 3, and a physical layout of a package 100 according to embodiments of the invention is illustrated in FIG. 4. Referring to FIGS. 3 and 4, an input matching circuit 12 is connected between an RF signal input lead 14 and a gate G of the transistor 15. The input matching circuit 12 may include an inductive wire bond connection including a bond wire 32 extending between the RF signal input lead 14 and a capacitor 36, and an inductive wire bond connection including a bond wire 34 extending from the capacitor 36 to the gate G of the transistor 15.

The source S of the transistor 15 is grounded, and an RF signal output lead 18 is connected to the drain D of the transistor 15 via an inductive wire bond connection including a bond wire 38 extending from the drain D of the transistor to the RF signal output lead 18.

Also provided within the package 100A is a harmonic reducer 116 that is connected between the drain D of the transistor 15 and ground. In the embodiments illustrated in FIG. 3, the harmonic reducer 116 includes an inductive element 120 in series with a shunt capacitor 122. As shown in FIG. 4, the shunt capacitor 122 may be mounted on the base 140 of the package 100A adjacent the transistor 15, and the inductive element 120 may include a bond wire extending from the transistor 15 to the shunt capacitor 122. In particular, the shunt capacitor 122 may be formed on the base 140 of the package 100A between the transistor 15 and the RF signal output lead 18. The inductive bond wire 38 may pass over the shunt capacitor 122.

It will be appreciated that the base of the package 100 can refer to any structural member on which the transistor 15 is mounted, and accordingly can correspond to a substrate, flange, die carrier, or the like.

The inductance of the inductive element 120 and the capacitance of the capacitor 122 may be selected so as to provide a short circuit and/or low impedance path to ground for signals at the harmonic frequency relative to the fundamental operating frequency of the transistor 15. For example, for a fundamental operating frequency of 2.5 GHz, the vales of capacitance and inductance may be selected to provide a short circuit at a frequency of 5 GHz. The selection of such values is known in the art. The actual values used may depend on the configuration and/or physical layout of the circuit. As an example and not by way of limitation, for a transistor designed to operate at a fundamental operating frequency f, the capacitance and inductance of the capacitor 122 and the inductive element 120, respectively, may be chosen to satisfy the equation:

$$2\pi f = \frac{1}{\sqrt{LC}}$$

As an example and not by way of limitation, assuming a fundamental operating frequency of 2.5 GHz, to provide a short circuit/low impedance path at the second harmonic frequency (i.e., at 5 GHz), the capacitor 122 may have a capacitance of about 4 pF, and the inductor may have an inductance of about 0.25 nH. The presence of the capacitor 122 may degrade the performance of the packaged device 100A in terms of power and/or efficiency, but such reduction in performance may be offset by the improvement in linearity over a wide frequency range that can be obtained according to some embodiments.

Figure 5:
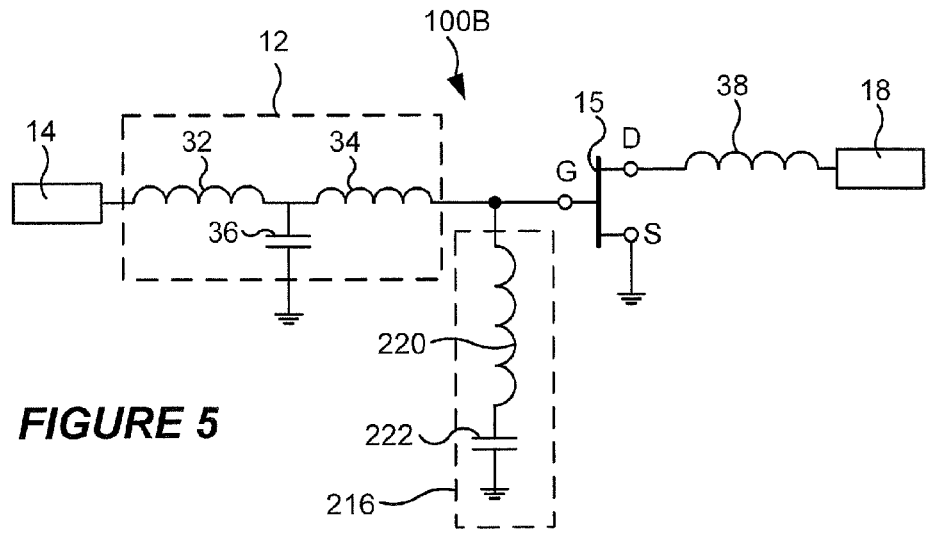
FIGS. 5-8 are schematic circuit diagrams of packaged RF power transistors according to some embodiments of the invention.

FIG. 5 is a schematic circuit diagram of a packaged RF power device 100B including a harmonic reducer 216 connected to the control terminal (gate G) of the transistor 15. In the embodiments illustrated in FIG. 5, the harmonic reducer 216 includes an inductive element 220 in series with a shunt capacitor 222. The inductance of the inductive element 220 and the capacitance of the capacitor 222 may be selected so as to provide a short circuit and/or low impedance path to ground for signals at a harmonic frequency, such as the second harmonic frequency, relative to the fundamental operating frequency of the transistor 15 at the input to the transistor 15.

Figure 6:
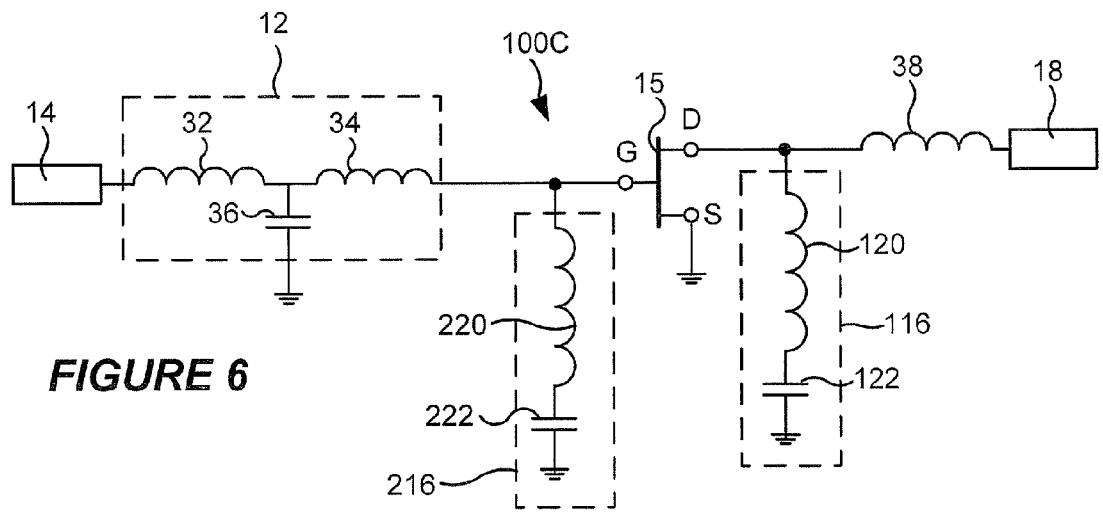

FIG. 6 is a schematic circuit diagram of a packaged RF power device 100C including a harmonic reducer 116 coupled to an output terminal (drain D) of the transistor 15 and a harmonic reducer 216 connected to the control terminal (gate G) of the transistor 15. In the embodiments illustrated in FIG. 6, the harmonic reducer 116 includes an inductive element 120 in series with a shunt capacitor 122, while the harmonic reducer 216 includes an inductive element 220 in series with a shunt capacitor 222. The inductances of the inductive elements 120, 220 and the capacitances of the capacitors 122, 222 may be selected so as to provide short circuits and/or low impedance paths to ground for signals at a harmonic frequency, such as the second harmonic frequency, relative to the fundamental operating frequency of the transistor 15 at both the input and the output of the transistor 15. However, it will be appreciated that the particular values selected for, e.g., the capacitors 122, 222 may be different due to the differing locations of the harmonic reducers 116, 216 relative to the transistor 15. For example, in some embodiments, the capacitance of the capacitor 222 may be greater than the capacitance of the capacitor 122.

Figure 7:
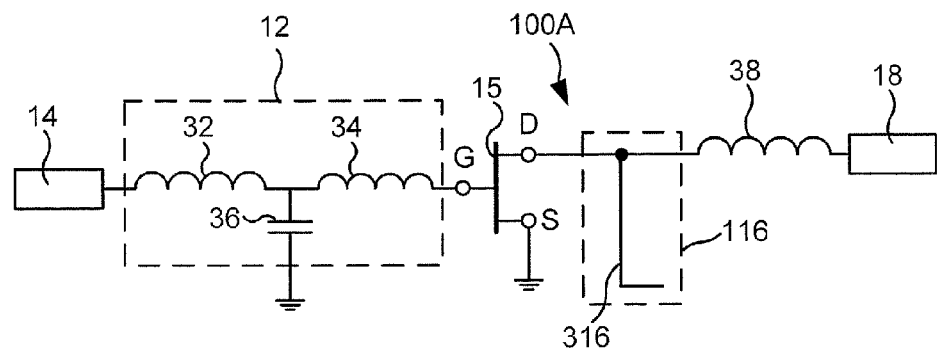

In other embodiments, the harmonic reducer may include a resonant structure, such as an open circuit quarter wave transmission line stub, which may be formed on the base 140 on which the transistor 15 is mounted. The quarter wave open transmission line stub has a length that is equal to one quarter of the wavelength of a harmonic frequency, and can present a short circuit to signals at the harmonic frequency. FIG. 7 is an exemplary schematic circuit diagram for a packaged RF transistor 100A including a harmonic reducer 116 implemented using an open circuit quarter-wave transmission line stub 316 connected at the output (drain D) of the transistor 15.

Figure 8:
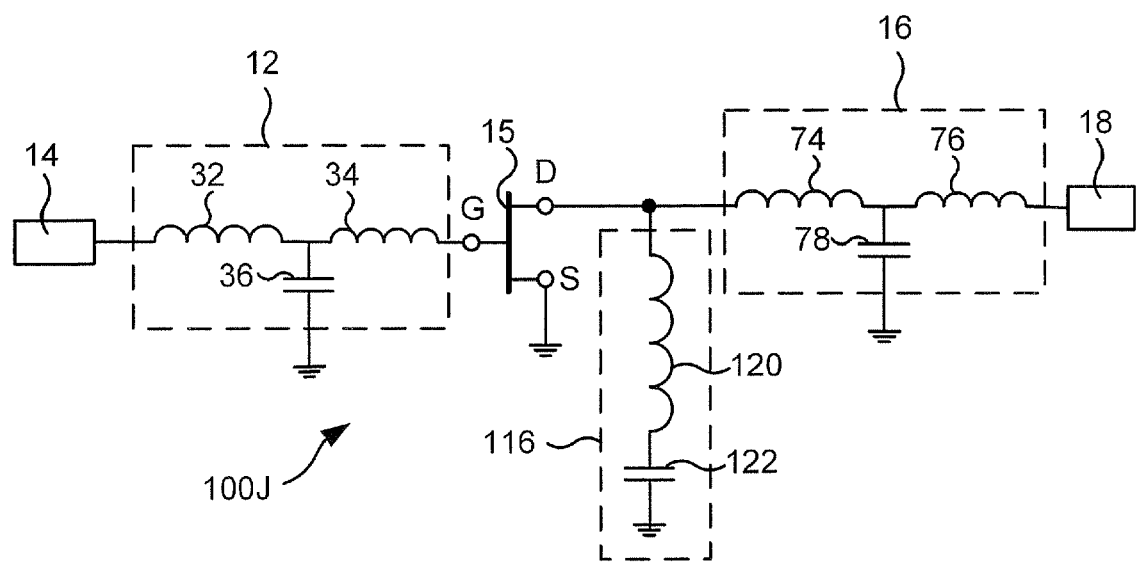

FIG. 8 is a schematic circuit diagram of a package 100J for an RF transistor including an output matching circuit 16 that is connected between an output terminal of the transistor 15 and the RF output lead 18. The output matching circuit 16 includes series inductances 76, 76 and a shunt capacitor 78.

Some embodiments of the invention provide multi-chip packages including a plurality of RF transistors. For example, FIGS. 9A and 9B are functional block diagrams of packaged multi-chip RF power transistors according to some embodiments of the invention, while FIG. 10 is a schematic circuit diagram of a packaged multi-chip RF power transistor according to some embodiments of the invention.

Figure 9A:
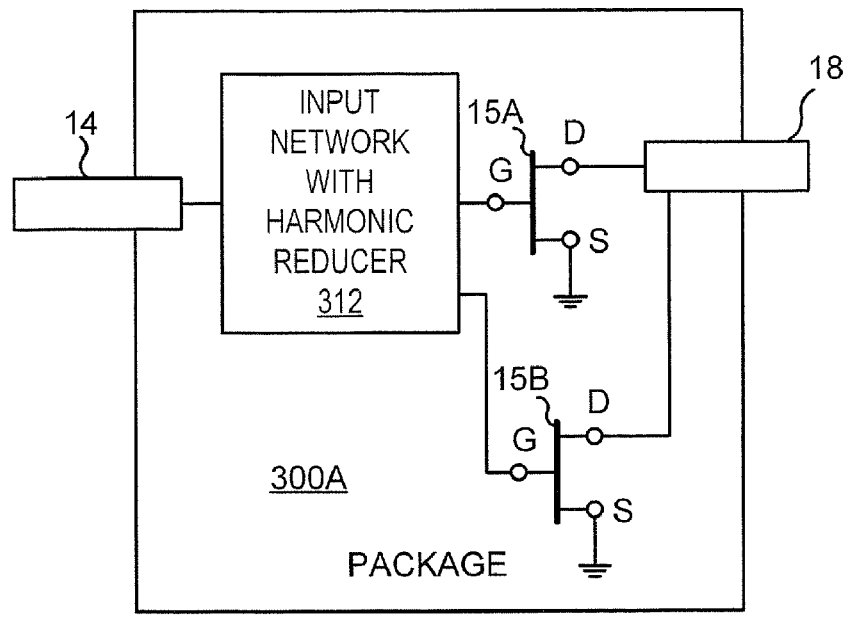
FIGS. 9A-9B are functional block diagrams of packaged multi-chip RF power transistors according to some embodiments of the invention.
Figure 9B:
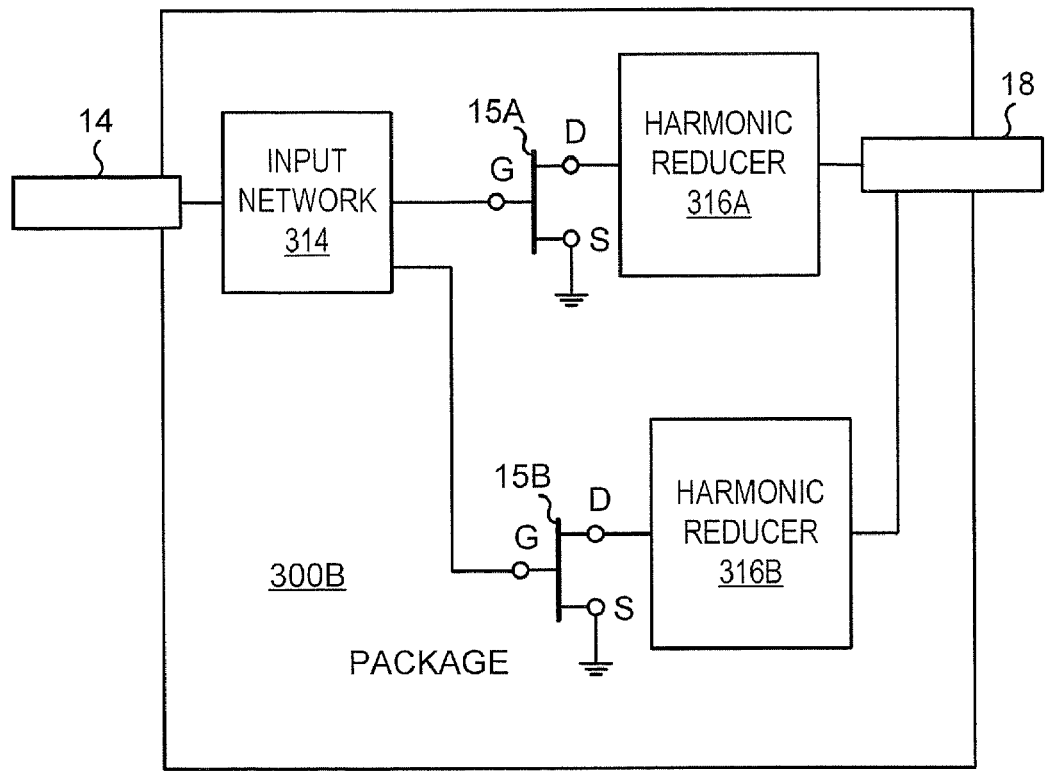

Referring to FIG. 9A, a multi-chip package 300A according to some embodiments of the invention includes an input network 312 including a harmonic reducer that is connected between an RF input lead 14 and control electrodes of first and second transistors 15A, 15B. The outputs of the transistors 15A, 15B are connected to an RF output lead 18.

Other configurations are possible. For example, as shown in FIG. 9B, a multi-chip package 300B according to some embodiments of the invention includes an input network 314 that is connected between an RF input lead 14 and control electrodes of first and second transistors 15A, 15B. A first harmonic reducer 316A is connected between an output terminal of the first transistor 15A and the RF output lead 18, and a second harmonic reducer 316B is connected between an output terminal of the second transistor 15B and the RF output lead 18.

Figure 10:
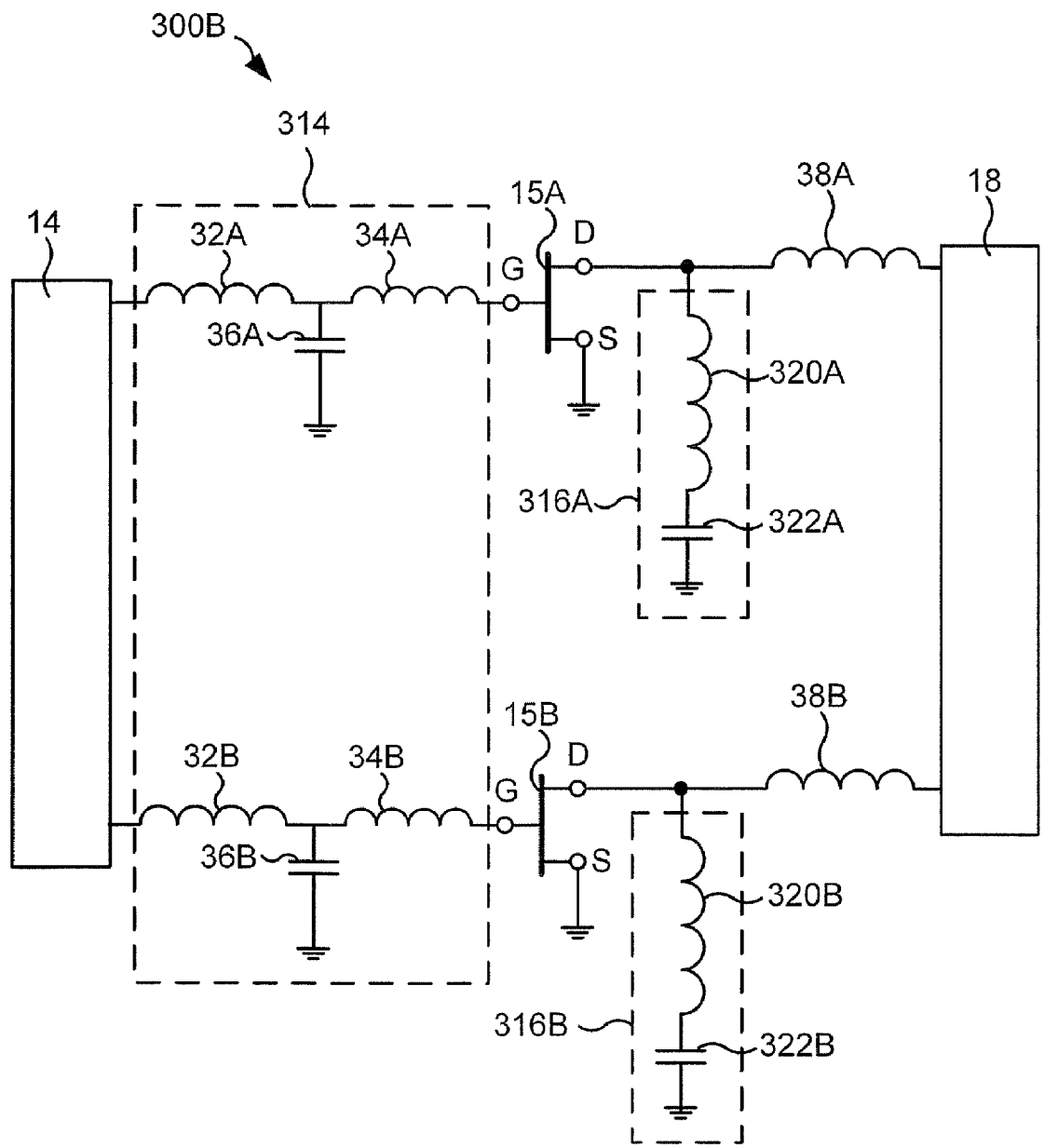
FIG. 10 is a schematic circuit diagram of a packaged multi-chip RF power transistor according to some embodiments of the invention.

A schematic circuit diagram of a packaged multi-chip RF power transistor 300B according to some embodiments of the invention is illustrated in FIG. 10. As shown therein, a multi-chip package 300B includes an input network 314 that is connected between an RF input lead 14 and control electrodes of first and second transistors 15A, 15B. The input network 314 includes series inductors 32A, 34A and a shunt capacitor 36A connected between the RF input lead 14 and the control terminal of the first transistor 15A, and series inductors 32B, 34B and a shunt capacitor 36B connected between the RF input lead 14 and the control terminal of the second transistor 15B. A first harmonic reducer 316A including an inductance 320A and a capacitor 322A is connected to an output terminal of the first transistor 15A, and a second harmonic reducer 316B including an inductance 320B and a capacitor 322B is connected to an output terminal of the second transistor 15B. Other configurations of multi-chip packages within the scope of the present invention will be apparent in view of the present application, including packages with input matching networks, output matching networks, input-side harmonic reducers and/or output-side harmonic reducers.

A packaged RF power transistor according to embodiments of the invention may be useful in a wide range of applications in which linearity is important. For example, a packaged power transistor according to embodiments of the invention may have application in systems, such as WiMAX, WCDMA, CDMA, and/or other systems, including future (4th generation) systems. In general, embodiments of the invention may be useful in any application in which linear performance is desired from a power transistor.

While embodiments of the invention have been described primarily in connection with a harmonic reducer configured to reduce signals at the second harmonic frequency of a fundamental operating frequency, it will be appreciated that a harmonic reducer may be configured, through appropriate selection of reactance values, to reduce signals at higher order harmonic frequencies. In general, a harmonic reducer according to some embodiments of the invention may be configured to reduce signals at Nth-order harmonic frequencies, where N>1. Furthermore, multiple harmonic reducers may be provided according to some embodiments to reduce signals at various different harmonic frequencies.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A packaged device, comprising:
   a transistor including a control terminal and an output terminal and configured to operate at a fundamental operating frequency;
   a signal input lead coupled to the control terminal of the transistor;
   a signal output lead coupled to the output terminal of the transistor;
   a harmonic reducer coupled to the control terminal of the transistor and configured to provide a low impedance path from the control terminal to ground for signals at a harmonic frequency of the fundamental operating frequency; and
   a package that houses the transistor and the harmonic reducer, with the signal input lead and the signal output lead extending from the package;
   wherein the harmonic reducer comprises a series resonant circuit including an inductive element and a shunt capacitor connected in series to a ground terminal.

2. The packaged power device of claim 1, further comprising an output-side harmonic reducer connected to the output terminal of the transistor.

3. The packaged power device of claim 1, further comprising an input matching circuit between the signal input lead and the control terminal of the transistor, wherein the harmonic reducer is coupled between the input matching circuit and the control terminal of the transistor.

4. The packaged RF power device of claim 1, further comprising an output matching circuit between the signal output lead and the output terminal of the transistor, wherein the harmonic reducer is coupled between the output matching circuit and the output terminal of the transistor.

5. The packaged power device of claim 1, further comprising an output matching circuit between the signal output lead and the output terminal of the transistor and/or an input matching circuit between the signal input lead and the control terminal of the transistor.

6. The packaged RF power device of claim 1, wherein the inductance of the inductive element and the capacitance of the capacitor are selected to provide a short circuit at the harmonic frequency of the fundamental operating frequency.

7. The packaged power device of claim 1, wherein the harmonic frequency of the fundamental operating frequency comprises the second harmonic frequency of the fundamental operating frequency.

8. A packaged power device, comprising:
   a transistor including a control terminal and an output terminal and configured to operate at a fundamental operating frequency;
   a signal input lead coupled to the control terminal of the transistor;
   a signal output lead coupled to the output terminal of the transistor;
   an input-side harmonic reducer coupled to the control terminal of the transistor and configured to provide a short circuit or low impedance path from the control terminal to ground for signals at a harmonic frequency of the fundamental operating frequency wherein the harmonic reducer is connected to the control terminal of the transistor;
   a package that houses the transistor and the harmonic reducer, with the signal input lead and the signal output lead extending from the package; and
   an output-side harmonic reducer connected to the output terminal of the transistor;
   wherein the input-side harmonic reducer comprises a first capacitor having a first capacitance and the output-side harmonic reducer comprises a second capacitor having a second capacitance that is different from the first capacitance.

9. A packaged device, comprising:
   a transistor including a control terminal and an output terminal and configured to operate at a fundamental operating frequency;
   a signal input lead coupled to the control terminal of the transistor;
   a signal output lead coupled to the output terminal of the transistor;
   a harmonic reducer coupled to the control terminal of the transistor and configured to provide a short circuit or low impedance path from the control terminal to ground for signals at a harmonic frequency of the fundamental operating frequency, wherein the harmonic reducer comprises a series resonant circuit including an inductive element and a shunt capacitor connected in series to a ground terminal;
   a package that houses the transistor and the harmonic reducer, with the signal input lead and the signal output lead extending from the package; and
   a base, wherein the transistor is on the base and wherein the shunt capacitor is on the base.

10. The packaged power device of claim 9, wherein the inductive element comprises a bond wire extending from the transistor to the shunt capacitor.

11. The packaged power device of claim 10, further comprising a second bond wire extending over the shunt capacitor from the transistor to the RF output lead.

12. A packaged device, comprising:
   a transistor including a control terminal and an output terminal and configured to operate at a fundamental operating frequency;
   a signal input lead coupled to the control terminal of the transistor;
   a signal output lead coupled to the output terminal of the transistor;
   a harmonic reducer coupled to the control terminal of the transistor and configured to provide a short circuit or low impedance path from the control terminal to around for signals at a harmonic frequency of the fundamental operating frequency; and
   a package that houses the transistor and the harmonic reducer, with the signal input lead and the signal output lead extending from the package;
   wherein the harmonic reducer comprises an open circuit quarter-wave transmission line stub.

13. The packaged power device of claim 12, wherein the open circuit quarter-wave transmission line stub has a length selected to provide the short circuit or low impedance path to ground for signals at the harmonic frequency of the fundamental operating frequency.

14. A packaged RF power device, comprising:
   a transistor including a control terminal and an output terminal and configured to operate at a fundamental operating frequency;
   an RF signal input lead coupled to the control terminal of the transistor;
   an RF signal output lead coupled to the output terminal of the transistor;
   a harmonic reducer coupled to the control terminal and/or the output terminal of the transistor and configured to provide a short circuit or low impedance path from the control terminal and/or the output terminal to ground for signals at an Nth harmonic frequency of the fundamental operating frequency; and a package that houses the transistor and the harmonic reducer, with the RF signal input lead and the RF signal output lead extending from the package;

wherein the transistor comprises a first transistor and the harmonic reducer comprises a first harmonic reducer, the package further comprising:

a second transistor including a control terminal and an output terminal and configured to operate at the fundamental operating frequency, wherein the RF signal input lead is coupled to the control terminal of the second transistor, and the RF signal output lead is coupled to the output terminal of the second transistor; and a second harmonic reducer coupled to the control terminal and/or the output terminal of the second transistor and configured to provide a short circuit or low impedance path from the control terminal and/or the output terminal of the second transistor to ground for signals at an Mth harmonic frequency of the fundamental operating frequency;

wherein the package also houses the second transistor and the second harmonic reducer.

15. A packaged power device, comprising:
a transistor including a control terminal and an output terminal and configured to operate at a fundamental operating frequency;
a signal input lead coupled to the control terminal of the transistor;
a signal output lead coupled to the output terminal of the transistor;
a harmonic reducer coupled to a first one of the control terminal or the output terminal of the transistor and configured to provide a short circuit or low impedance path from the control terminal and/or the output terminal to ground for signals at an Nth harmonic frequency of the fundamental operating frequency, where N>1;
a package that houses the transistor and the harmonic reducer, with the input lead and the output lead extending from the package; and
a further harmonic reducer housed in the package and coupled to a second one of the control terminal or the output terminal of the transistor, wherein the further harmonic reducer is configured to provide a second short circuit or low impedance path from the control terminal or the second output terminal to ground for signals at an Mth harmonic frequency of the fundamental operating frequency, where M>1 and M≠N.

16. The packaged power device of claim 15, wherein the harmonic reducer and the further harmonic reducer each include a series resonant circuit including an inductive element and a capacitor.

17. The packaged power device of claim 15, wherein at least one of the harmonic reducer and the further harmonic reducer includes an open circuit quarter-wave transmission line stub.

18. A method of forming a packaged power device, comprising:
mounting a transistor on a base, the transistor including a control terminal and an output terminal and being configured to operate at a fundamental operating frequency;
forming a harmonic signal reducer on the base and connecting the harmonic signal reducer to the control terminal of the transistor, wherein the harmonic signal reducer is configured to provide a short circuit or low impedance path from the control terminal to ground for signals at an Nth harmonic frequency of the fundamental operating frequency, where N>1;
providing a signal input lead and a signal output lead on opposite sides of the base;
connecting the signal input lead to the control terminal and connecting the signal output lead to the output terminal; and
forming a package housing on the transistor and the harmonic reducer, with the signal input lead and the signal output lead extending from the package;
wherein forming the harmonic signal reducer comprises providing a capacitor on the base and forming a wire bond connection between the capacitor and the transistor.

19. The method of claim 18, wherein providing the capacitor on the base comprises providing the capacitor on the base between the output terminal of the transistor and the signal output lead, and wherein forming the wire bond connection comprises forming the wire bond connection between the capacitor and the output terminal of the transistor.

20. The method of claim 19, wherein connecting the RF signal output lead to the output terminal comprises forming a second wire bond connection, the second wire bond connection including a bond wire extending over the capacitor from the output terminal to the signal output lead.

21. A packaged device, comprising:
a transistor including a control terminal and an output terminal;
a signal input lead coupled to the control terminal of the transistor;
a signal output lead coupled to the output terminal of the transistor;
a harmonic reducer coupled to the control terminal of the transistor; and
a base, wherein the transistor and the harmonic reducer are on the base, wherein the harmonic reducer includes an inductive element and a shunt capacitor.

22. The packaged device of claim 21, wherein the shunt capacitor is connected to a ground terminal.

* * * * *

UNITED STATES PATENT AND TRADEMARK OFFICE
CERTIFICATE OF CORRECTION

| | | |
|---|---|---|
| PATENT NO. | : 8,076,994 B2 | Page 1 of 1 |
| APPLICATION NO. | : 11/767161 | |
| DATED | : December 13, 2011 | |
| INVENTOR(S) | : Farrell et al. | |

It is certified that error appears in the above-identified patent and that said Letters Patent is hereby corrected as shown below:

On the Title Page:
Item (57) Abstract, line 1: Please correct "packaged RE power"
                                to read -- packaged RF power --

In the Claims:
Column 10, Claim 12, Line 44: Please correct "terminal to around"
                                to read -- terminal to ground --

Signed and Sealed this
Third Day of April, 2012

David J. Kappos
*Director of the United States Patent and Trademark Office*